United States Patent
Lin et al.

(10) Patent No.: US 7,361,546 B2
(45) Date of Patent: Apr. 22, 2008

(54) METHOD OF FORMING CONDUCTIVE STUD ON VERTICAL MEMORY DEVICE

(75) Inventors: Shian-Jyh Lin, Chiayi (TW);
Chia-Sheng Yu, Taipei (TW);
Wen-Sung Tsou, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 104 days.

(21) Appl. No.: 10/704,911

(22) Filed: Nov. 12, 2003

(65) Prior Publication Data

US 2005/0101141 A1 May 12, 2005

(51) Int. Cl.
*H01L 21/8242* (2006.01)
(52) U.S. Cl. ............... 438/243; 438/248; 257/E21.551; 257/E21.548
(58) Field of Classification Search ............... 438/745, 438/692, 691, 690, 689, 633, 600, 597, 255, 438/243, 240, 386, 244, 245, 246, 247, 248; 257/700, 649, 306, 302, E21.551, E21.548
See application file for complete search history.

(56) References Cited

U.S. PATENT DOCUMENTS

| | | | | |
|---|---|---|---|---|
| 6,083,787 A | * | 7/2000 | Lee ............................ | 438/243 |
| 6,258,654 B1 | * | 7/2001 | Gocho ........................ | 438/240 |
| 6,281,539 B1 | * | 8/2001 | Mandelman et al. ....... | 257/302 |
| 6,747,306 B1 | * | 6/2004 | Dyer .......................... | 257/302 |
| 6,884,676 B2 | * | 4/2005 | Arnold et al. .............. | 438/243 |

\* cited by examiner

*Primary Examiner*—Walter Lindsay, Jr.
(74) *Attorney, Agent, or Firm*—Birch, Stewart, Kolasch & Birch, LLP

(57) ABSTRACT

A method of forming a conductive stud is provided. The method includes providing a substrate which has an upper surface and an opening. The opening exposes a portion of a vertical memory device. A conductive layer is formed over the substrate to fill the opening. A chemical mechanical polishing is performed on the conductive layer to form a conductive stud having an upper surface substantially lower than the upper surface of the substrate.

13 Claims, 5 Drawing Sheets

METHOD OF FORMING CONDUCTIVE STUD ON VERTICAL MEMORY DEVICE

FIELD OF INVENTION

The present invention generally relates to a method of forming a conductive stud, and more particularly, to a method of forming a polysilicon conductive stud on a vertical memory device.

BACKGROUND OF THE INVENTION

In the manufacture of conventional vertical memory devices, a spacer is generally formed on the sidewall of a contact opening before a conductive stud fills up the opening, so as to enhance the insulation between the conductive stud and the other conductive materials or contacts. However, the spacer is usually formed without a perfect vertical profile, which causes the conductive stud has a larger width on its top portion than on the bottom portion. In other words, due to the imperfect profile of the spacer, the conductive stud generally has an overhang around its top portion. As shown in FIG. 1, a conventional conductive stud 10 with the overhang 14 is formed because of the imperfect profile of the spacer 12. Because of the existence of overhang 14, the space between two wires or contacts will be reduced, and the process widow of manufacturing subsequent interconnections is accordingly decreased, which usually leads to short circuit of devices.

Implementing extra processes, such as etching and deposition, is usually a conventional way to eliminate the overhang. For example, when a conductive stud with an overhang is formed, portions of the spacer and the dielectric layer encircling the conductive stud are etched to expose the overhang. Then, a conductive layer is deposited to cover the overhang and then planarized, so as to remove the overhang. These extra processes complicate the manufacture procedure and increase the cost of production. Therefore, there is a need to provide a method of forming a conductive stud free of overhang at low cost.

SUMMARY OF THE INVENTION

One aspect of the present invention is to provide a method of forming a conductive stud, which eliminates the existence of an overhang so as to prevent short circuit induced by overhang.

Another aspect of the present invention is to provide a method of forming a conductive stud, which implements a chemical mechanical polishing process to eliminate an overhang at law cost.

In one embodiment of the present invention, a method of forming a conductive stud includes providing a substrate, which has an upper surface and an opening. The substrate can be a substrate in manufacture of a vertical memory device, and the opening exposes a portion of the vertical memory device. A conductive layer is formed over the substrate to fill the opening. A chemical mechanical polishing is then performed on the conductive layer to form a conductive stud in the opening. The conductive stud has an upper surface lower than the upper surface of the substrate. The chemical mechanical polishing process is preferably performed with a slurry provided at a flow rate of about 100 to 200 cm$^3$/min, at a turntable rotation speed of about 20 to 100 rpm, a top ring rotation speed of about 20 to 140 rpm, and a top ring pressure of about 20000 to 50000 pa, when the conductive layer is a polysilicon layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE INVENTION

The present invention discloses a method of forming a conductive stud, which utilizes a chemical mechanical process to eliminate an overhang of the stud at low cost and high efficiency. FIGS. 2 to 4 illustrate preferred embodiments of the present invention.

Figure 1:
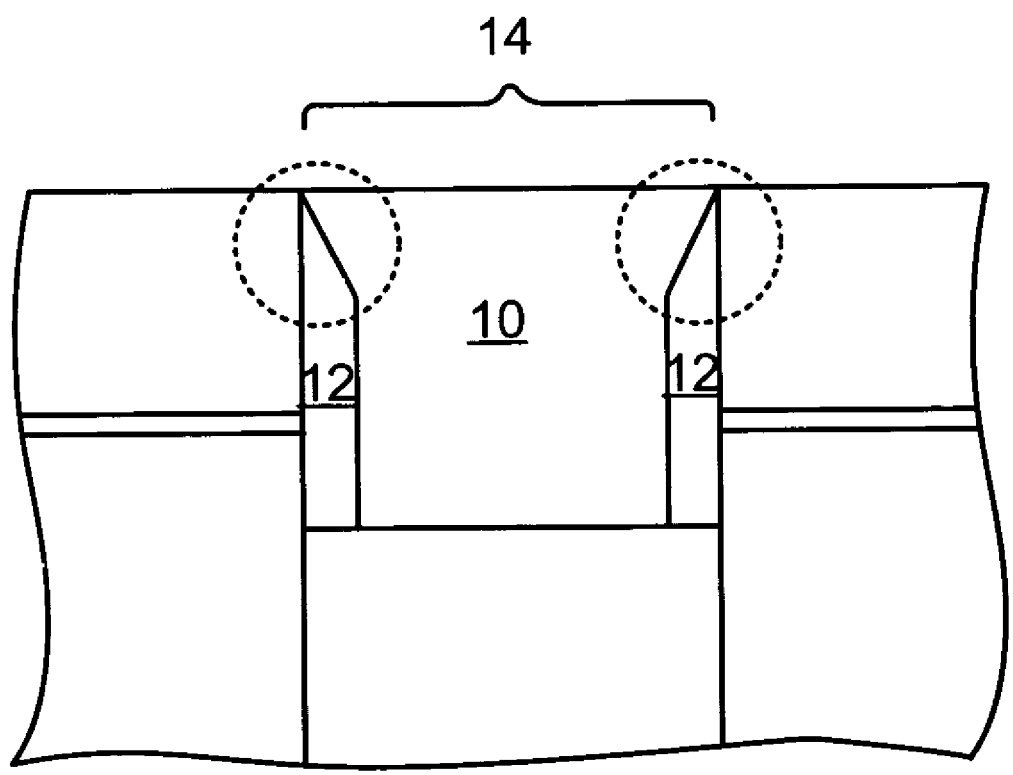
FIG. 1 illustrates a cross-sectional view of a conventional conductive stud.
Figure 2A:
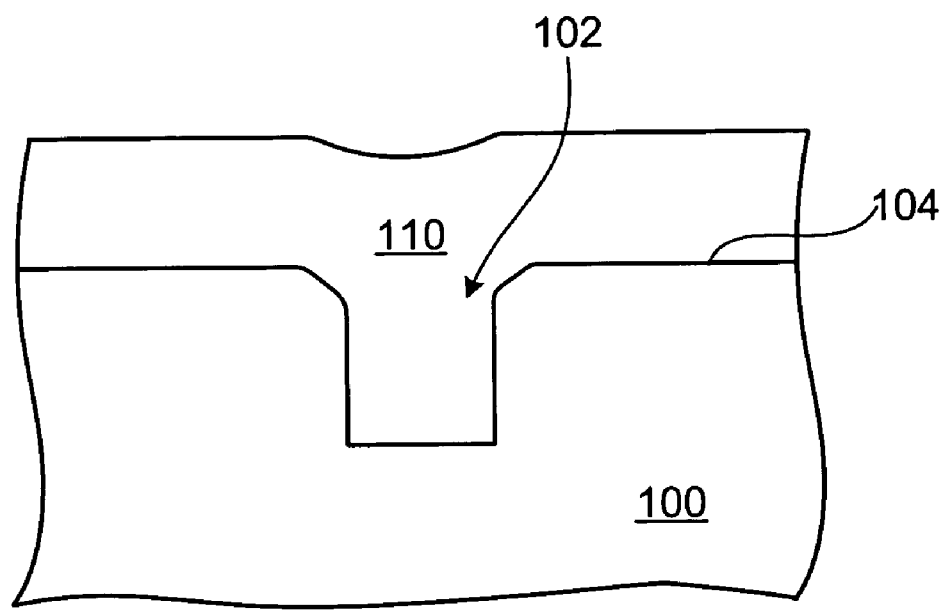
FIG. 2A illustrates a cross-sectional view of a conductive layer in a first embodiment of the present invention.
Figure 2B:
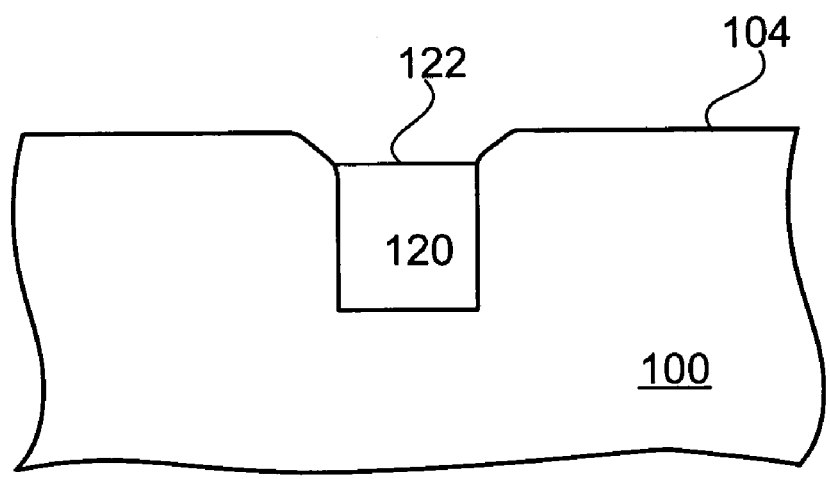
FIG. 2B illustrates a cross-sectional view of a conductive stud formed in the structure of FIG. 2A.

Referring to FIG. 2A, in one embodiment of the present invention, a method of forming a conductive stud includes providing a substrate 100 which has an opening 102 and an upper surface 104. The substrate 100 can be a substrate at any stage of forming a semiconductor device which needs interconnection, for example, a silicon wafer in manufacture of vertical memory devices. In such a case, the opening 102 may expose a portion of the vertical memory device. Then, a conductive layer 110 is formed over the substrate 100 to fill the opening 102. A chemical mechanical polishing is next performed on the conductive layer 110 to form a conductive stud 120 in the opening 102. As shown in FIG. 2B, the conductive stud 120 has an upper surface 122 lower than the upper surface 104 of the substrate 100. In other words, the present invention implements the chemical mechanical polishing process to planarize the conductive layer 110, and moreover, to further polish the conductive layer 120 to form the conductive stud 120 embedded lower than the upper surface 104 of the substrate 100.

For example, the substrate 100 has a dielectric layer, such as a nitride layer, representing as the upper surface, and the conductive layer 110 is a chemical vapor deposited polysilicon layer. When the polysilicon layer is polished, the chemical mechanical polishing is performed with a slurry provided at a flow rate of about 100 to 200 cm$^3$/min, at a turntable rotation speed of about 20 to 100 rpm, a top ring rotation speed of about 20 to 140 rpm, and a top ring pressure of about 20000 to 50000 pa. When the opening 102 has a profile of larger width at the top portion; for example, when a spacer appears in the opening, the conductive stud formed with a substantially lower upper surface eliminates the overhang around its upper portion, and therefore a short circuit is prevented and the process window for subsequent processes is improved.

Figure 3A:
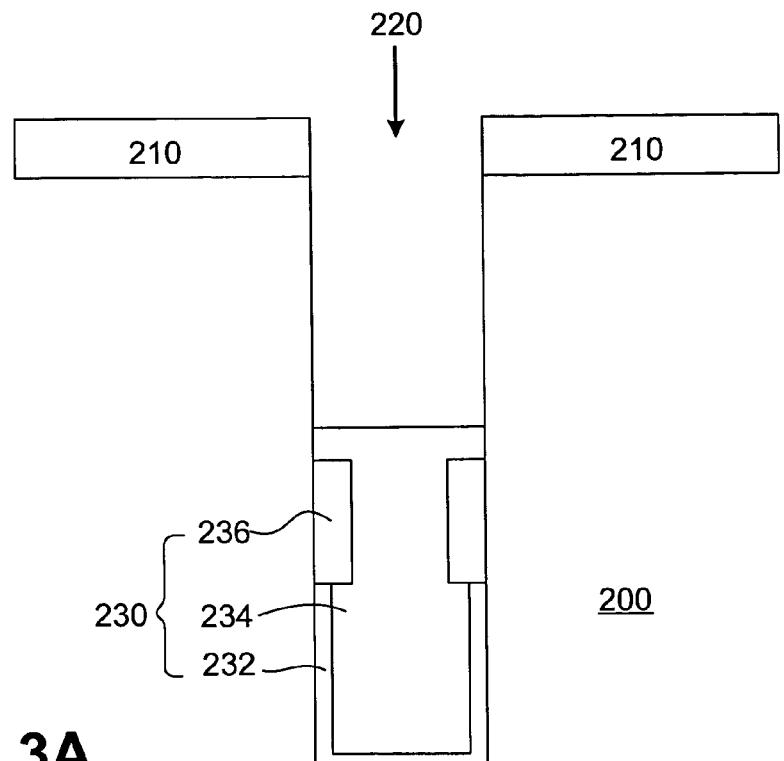
FIG. 3A-3D illustrate cross-sectional views of forming a conductive stud on a vertical memory device in a second embodiment of the present invention.
Figure 4:
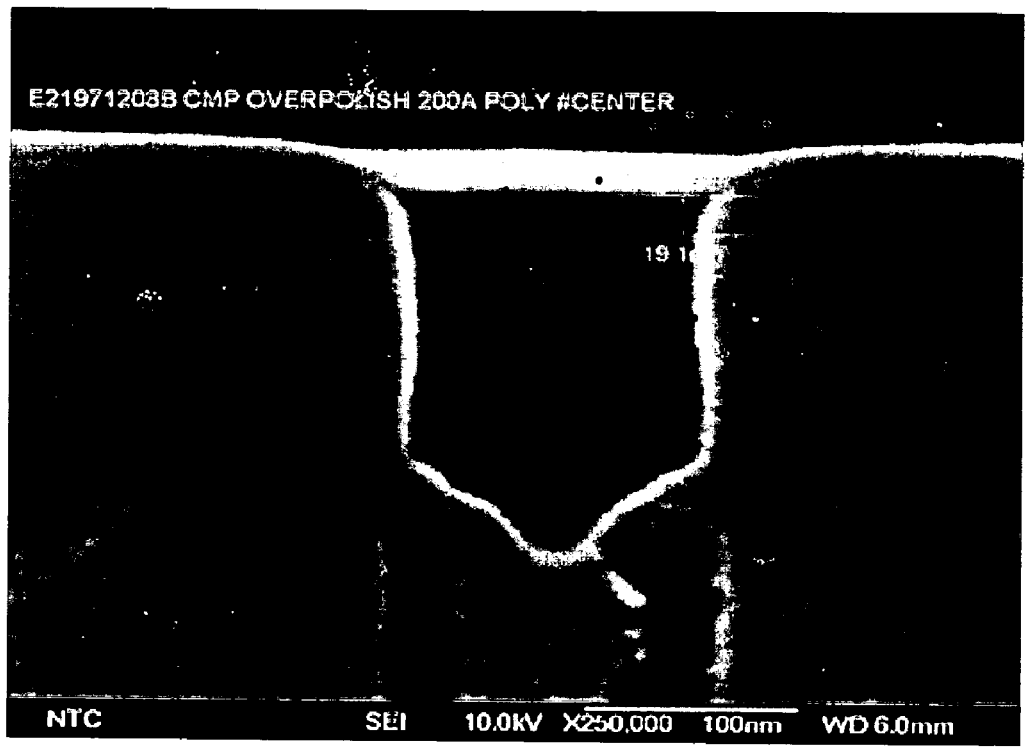
FIG. 4 illustrates a SEM graph of a conductive stud by implementing the present invention.

Referring to FIG. 3A, in another embodiment of the present invention, a method of forming a conductive stud on a vertical memory device is provided. The method includes providing a semiconductor substrate 200, which can be any suitable semiconductor substrate, such as a silicon wafer. A pad dielectric layer 210, such as a nitride layer, an oxide layer or the combination thereof, is formed on the semiconductor substrate 200. Then, a deep trench 220 is formed in the semiconductor substrate 200. The deep trench 220 can be formed by conventional processes, such as photolithography, etch, etc. A trench capacitor 230 is then formed in a lower portion of the deep trench 220. It is noted that the trench capacitor 230 includes conventional elements, such as a node dielectric layer 232, a conductive layer 234, a collar dielectric layer 236, which are not deliberately described herein.

Figure 3B:
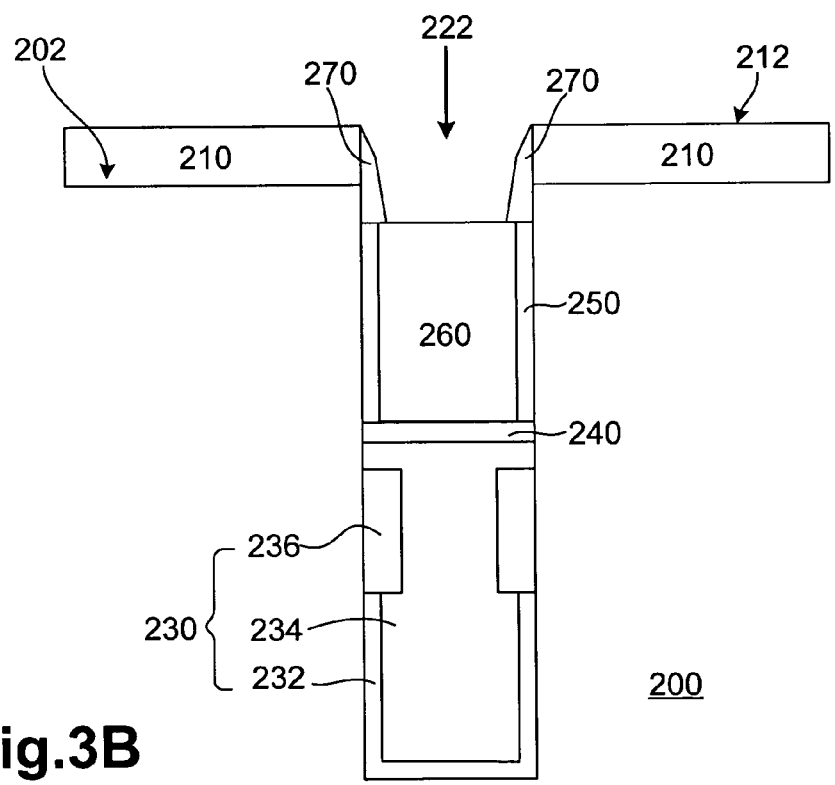

As shown in FIG. 3B, a dielectric layer 240 isolating the lower portion and a higher portion of the trench capacitor 230 is formed on the trench capacitor 230. A gate dielectric layer 250 is formed on a sidewall of the higher portion of the deep trench 220. Then, a conductive layer 260, such as a polysilicon layer, is formed over the pad dielectric layer 210 to fill the deep trench 220. A portion of the conductive layer 260 is removed, so that an opening 222 is formed. It is noted that the pad dielectric layer 210, the trench capacitor 230, the dielectric layer 240, the gate dielectric layer 250, the conductive layer 260 can be formed by conventional processes, such as deposition, oxidation, etching, etc.

Referring to FIG. 3B, the opening 222 is deep into the semiconductor substrate 200. In other words, the bottom of the opening 222 is lower than the upper surface 202 of the semiconductor substrate 200. Conventional processes can achieve the formation of the conductive layer 260 and the opening 222. For example, the conductive layer 260 is formed by chemical vapor deposition which fills up the deep trench 220, and is then etched to form the opening 222. A spacer 270 is then formed on the sidewall around the opening 222. The spacer 270 can be any layer made of suitable dielectric material, such as a nitride layer, and is formed by conventional processes, such as deposition and etching. It is noted that the conductive layer 260 is etched back to form the opening 222 for the purpose of utilizing the spacer 270 to enhance the insulation between a subsequent conductive layer 280 and the semiconductor substrate 200 or other subsequent contacts (i.e. bit line contacts). Therefore, the process at this stage provides a substrate structure having an opening (222) and an upper surface (the upper surface 212 of the pad dielectric layer 210).

Figure 3C:
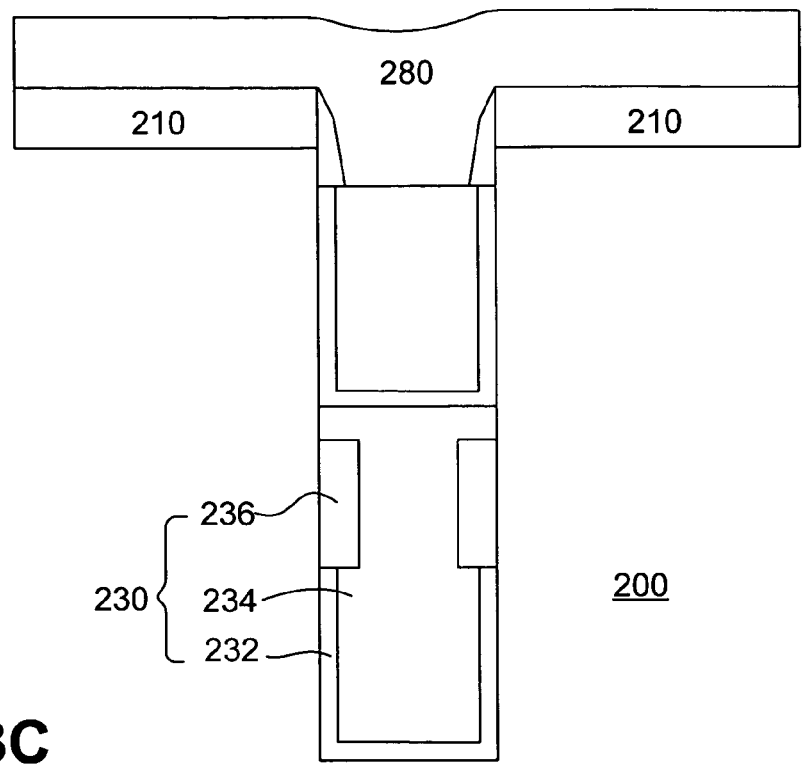
Figure 3D:
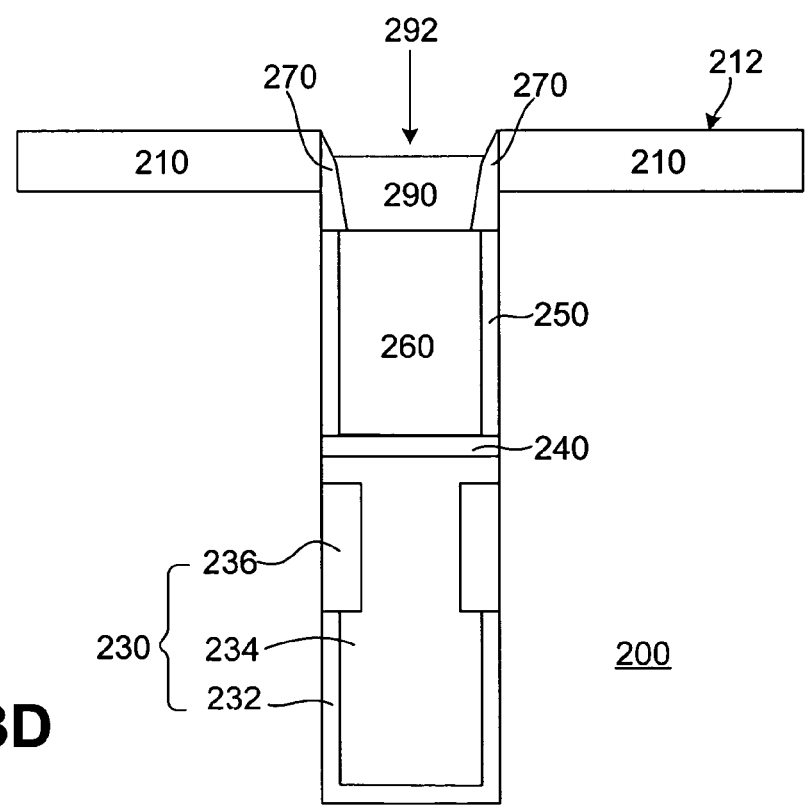

As shown in FIG. 3C, a polysilicon layer 280 is deposited over the pad dielectric layer 210 to fill the deep trench (i.e. the opening 222). As shown in FIG. 3D, a chemical mechanical polishing is performed on the polysilicon layer 280 to form a polysilicon stud 290 in the higher portion of the deep trench (i.e. in the opening 222), and the polysilicon stud 290 has an upper surface 292 lower than the upper surface 212 of the pad dielectric layer 210. In other words, the present invention implements the chemical mechanical polishing process to planarize the polysilicon layer 280, and moreover, to further polish the polysilicon layer 280 to form the polysilicon stud 290 embedded lower than the upper surface 212 of the pad dielectric layer 210. For example, the chemical mechanical polishing is performed with a slurry provided at a flow rate of about 100 to 200 cm$^3$/min, at a turntable rotation speed of about 20 to 100 rpm, a top ring rotation speed of about 20 to 140 rpm, and a top ring pressure of about 20000 to 50000 pa. Because of the appearance of the spacer 270, the opening 222 has a profile of larger width on the top. The present invention implements the chemical mechanical polishing to prevent the polysilicon stud from having an overhang.

As shown in FIG. 4, a SEM graph shows that after polished by the chemical mechanical polishing process, a conductive stud is free of overhang. Therefore, the space between two wires or contacts and the process widow of manufacturing subsequent interconnections can be maintained.

Although specific embodiments have been illustrated and described, it will be obvious to those skilled in the art that various modifications may be made without departing from what is intended to be limited solely by the appended claims.

What is claimed is:

1. A method of forming a polysilicon stud on a vertical memory device, comprising:
   providing a semiconductor substrate;
   forming a pad dielectric layer on said semiconductor substrate;
   forming a deep trench in said semiconductor substrate;
   forming a trench capacitor in a lower portion of said deep trench;
   forming a gate dielectric layer on a sidewall of a higher portion of said deep trench;
   forming a conductive layer over said gate dielectric layer to fill said deep trench, and removing a portion of said conductive layer to expose said gate dielectric layer;
   forming a spacer above said gate dielectric layer and within said deep trench;
   forming a polysilicon layer over said pad dielectric layer to fill said deep trench; and
   performing a chemical mechanical polishing on said polysilicon layer to remove an overhang over a top corner of said deep trench so as to form said polysilicon stud in said higher portion of said deep trench, said polysilicon stud having comprising an upper surface lower than an upper surface of said pad dielectric layer in said higher portion of said deep trench.

2. The method of claim 1, wherein said pad dielectric layer is selected from a group consisting of nitride layer, oxide layer, and the combination thereof.

3. The method of claim 1, wherein said polysilicon layer is formed by chemical vapor deposition process.

4. The method of claim 1, wherein said polishing step is performed with a slurry provided at a flow rate of about 100 to 200 cm3/min.

5. The method of claim 1, wherein said polishing step is performed at a turntable rotation speed of about 20 to 100 rpm.

6. The method of claim 1, wherein said polishing step is performed at a top ring rotation speed of about 20 to 140 rpm.

7. The method of claim 6, wherein said polishing step is performed at a top ring pressure of about 20000 to 50000 pa.

8. A method of forming a conductive stud, comprising:
   providing a substrate comprising an opening and an upper surface;
   forming a spacer on a sidewall of the opening;
   forming a conductive layer over the substrate to fill the opening;
   performing a polish on the conductive layer to form the conductive stud comprising an upper surface lower than the upper surface of the substrate.

9. The method of claim 8, wherein said step of forming a conductive layer comprises forming a polysilicon layer.

10. The method of claim 8, wherein said polishing step is performed with a slurry provided at a flow rate of about 100 to 200 cm3/min.

11. The method of claim 8, wherein said polishing step is performed at a turntable rotation speed of about 20 to 100 rpm.

12. The method of claim 8, wherein said polishing step is performed at a top ring rotation speed of about 20 to 140 rpm.

13. The method of claim 8, wherein said polishing step is performed at a top ring pressure of about 20000 to 50000 pa.

* * * * *